United States Patent [19]
Wieth et al.

[11] Patent Number: 5,233,231
[45] Date of Patent: Aug. 3, 1993

[54] CONTROL-SAFE CAPACITIVE SWITCH

[75] Inventors: Hermann Wieth, Chagrin Falls, Ohio; Hans-Jürgen Schiefer, Böhl-Iggelheim, Fed. Rep. of Germany

[73] Assignee: Pepperl + Fuchs, Inc., Twinsburg, Ohio

[21] Appl. No.: 800,219

[22] Filed: Nov. 29, 1991

[51] Int. Cl.$^5$ .................. H01H 35/00; F16D 9/00
[52] U.S. Cl. ................................ 307/116; 307/328; 192/129 R
[58] Field of Search ............. 340/551, 552, 561, 568, 340/573, 562; 192/129 A–132; 328/1, 5, 7; 173/170; 307/116–118, 308, 326, 328; 361/179, 182, 189, 190, 184, 192; 200/600, 61.85

[56] References Cited

U.S. PATENT DOCUMENTS

| | | | |
|---|---|---|---|
| 3,081,594 | 3/1963 | Atkins et al. | 58/50 |
| 3,728,501 | 4/1973 | Larson et al. | 200/52 |
| 3,813,021 | 5/1974 | Kramer | 228/1 |
| 4,090,092 | 5/1978 | Serrano | 307/116 |
| 4,211,098 | 7/1980 | Luenser | 72/21 |
| 4,412,268 | 10/1983 | Dassow | 361/181 |
| 4,493,377 | 1/1985 | Günther et al. | 173/170 |
| 4,794,273 | 12/1988 | McCullough et al. | 307/139 |
| 5,168,173 | 12/1992 | Windsor | 307/116 |

OTHER PUBLICATIONS

P+F Proximity Sensors, Pepperl + Fuchs Inc. Catalog (Copyright 1989) pp. 112–124.

*Primary Examiner*—A. D. Pellinen
*Assistant Examiner*—Richard T. Elms
*Attorney, Agent, or Firm*—Fay, Sharpe, Beall, Fagan, Minnich & McKee

[57] ABSTRACT

A palm-button control system provides for machinery control with minimized operator hand pressure by use of capacitive switches and reduced susceptibility to radio frequency interference. The system employs first and second capacitive palm-button switches, both of which must be contacted before machinery is activated. Each capacitive palm-button includes a radio frequency sensor which functions to disable machine activation in the presence of a sufficiently strong radio signal. Circuitry for periodically testing the radio frequency sensors provides periodic visual operator feedback indicative of operability of the system. All controls are synchronized or enabled in accordance with a series of digital pulses.

15 Claims, 6 Drawing Sheets

CONTROL-SAFE CAPACITIVE SWITCH

BACKGROUND OF THE INVENTION

This application pertains to the art of control-safe operator machine control and more particularly to operator machine control using capacitive switches. The invention is particularly applicable to operation of potentially dangerous machinery such as that used in metal stamping, punch presses, and the like, and will be described with particular reference thereto. However, it will be appreciated that the invention has broader application as in any repetitively activated machinery for which minimization of operator hand pressure is advantageous.

A substantial portion of industrial machinery requires continuous interaction with human operators. Examples of machinery of this nature includes metal forming equipment, such as punch presses or stamping machines, wherein an operator places a workpiece into the machine, activates the machine, and removes a completed workpiece. This process is repeated a substantial number of times in typical mass-production environments.

Presently, most metal forming equipment such as that described above, provides for two switches, both of which must be contacted to activate the machine. The switches are typically located and situated so as to discourage operators from circumventing the use of both operator hands to activate the machine. This provides for increased operator safety by minimizing an opportunity for a hand to be placed in the vicinity of the machinery during operation.

Employers are becoming increasingly aware of possible dangers associated with repetitive, mechanical actions of operators. One noted effect of continued and repetitive hand motions is that of carpel-tunnel syndrome. Switches typically employed in machinery control are contact, mechanically-operated push-button switches. Operation of these switches result in the repetitive forces on operator hand which may augment susceptibility to such maladies as carpel-tunnel syndrome.

Capacitive switches provide for electrical switching without mechanical switch toggling. Commonly available switches of this nature include capacitive proximity sensors marketed by Pepperl+Fuchs, Inc., the assignee of the subject application. Several varieties of these sensors are provided in the assignee's 1989 catalog, pages 112–123, the contents of which are incorporated herein by reference.

Common capacitive proximity sensors sense capacitive changes induced by certain objects placed proximate thereto. The human hand provides the capacitive changes for activation of the switches.

Capacitive switches are advantageously employed in a number of situations. They provide certain disadvantages when applied to uses in connection with control of machinery. Proximity sensors, such as capacitive switches, may be influenced to triggering by the presence of radio frequency interference ("RFI"). Such RFI is often found in industrial or manufacturing environments. The RFI may be induced by machinery as well as radio communication devices. Such spurious RFI may result in triggering of machinery for which capacitive proximity sensors have been used. If such a triggering coincides with placement of an operator's hand in the machinery, severe injury may result. Furthermore, conventional electronic control systems, particularly digital control systems, are succeptable to failure due to "stuck-at" faults in their control circuitry which may also lead to improper machine switching.

The present invention contemplates a new and improved switching system which addresses all of the above-referred problems, and others, and provides for machine operation with improved RFI immunity and minimized physical strain on the operator.

SUMMARY OF THE INVENTION

In accordance with the present invention, a switching system includes a first capacitive switch unit. The capacitive switch unit includes a capacitive sensor terminal and a radio frequency sensor terminal disposed proximate thereto. A sensor means senses a voltage induced within the capacitive sensor terminal by an associated object proximate thereto. A radio frequency sensor senses a voltage induced within the radio frequency sensor terminal. A trigger signal is generated by the capacitive sensor. This trigger signal provides a means by which engagement or activation of an associated machine is suitably controlled. The trigger signal is advantageously suppressed in the presence of radio frequency as sensed by the radio frequency sensor.

In accordance with a more limited aspect of the present invention, a system is provided for periodically testing operability of the radio frequency sensor means.

In accordance with another aspect of the present invention, an indicator is provided, the output of which indicates the operability of the radio frequency sensor.

In accordance with another aspect of the present invention, first and second capacitive switch units are provided, both of which must be activated to enable an associated machine.

An advantage of the present invention is provided with a switching mechanism which minimizes adverse physical effects associated with repetitive machine control.

Yet another advantage of the present invention is the provision of a machine controller with improved immunity from spurious radio frequency emissions.

Yet another advantage of the present invention is the provision of a system which provides an indication as to operability of an RFI sensor.

Further advantages will become apparent to one of ordinary skill in the art upon reading and understanding the subject specification.

BRIEF DESCRIPTION OF THE DRAWINGS

This invention may take physical form in certain parts and arrangements of parts, or the practice of certain steps, a preferred embodiment of which will be described in detail in this specification and illustrated in the accompanyings which form a part hereof and wherein.

DETAILED DESCRIPTION OF THE PREFERRED EMBODIMENT

Figure 1:
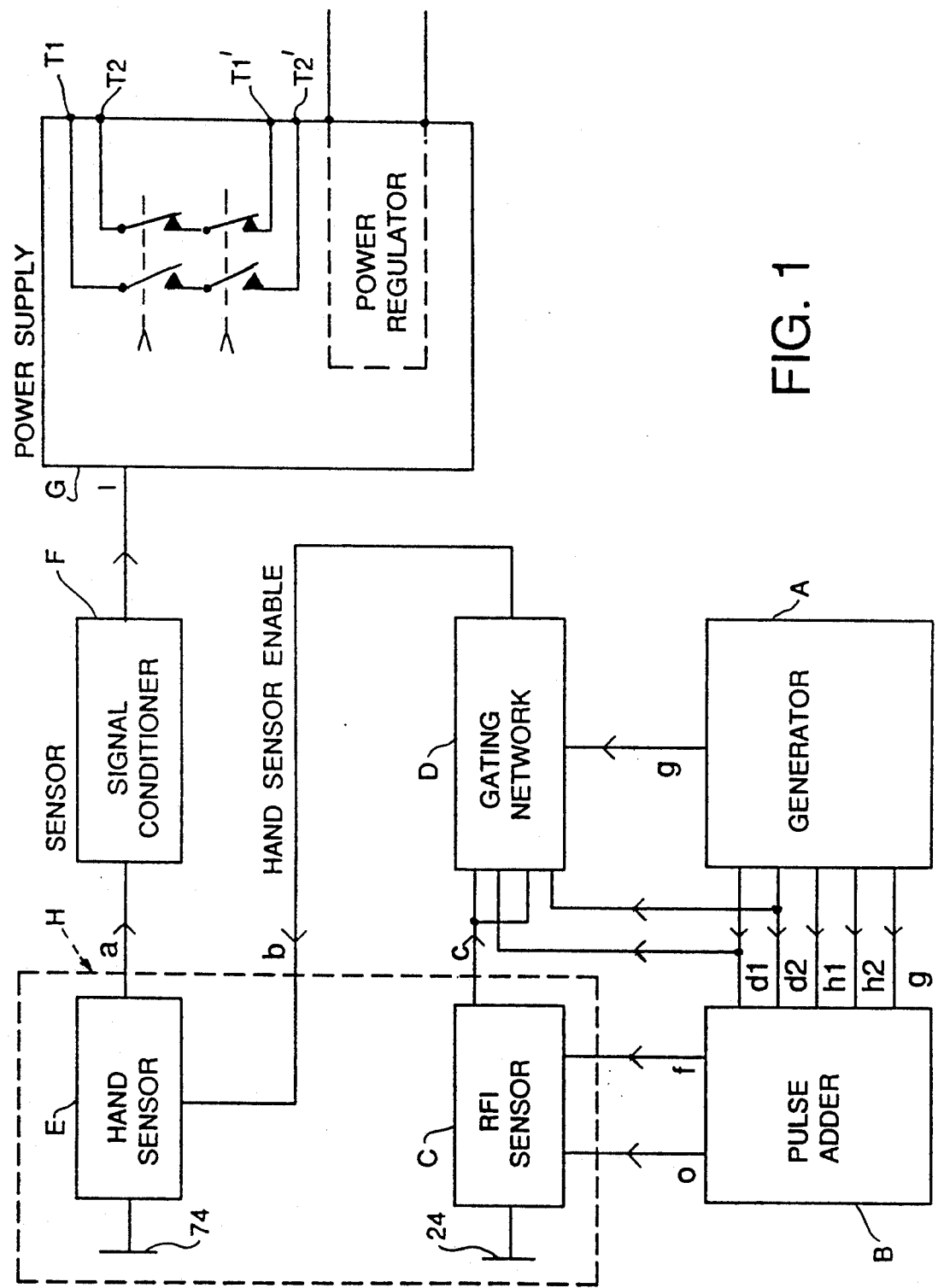
FIG. 1 is a block diagram of a capacitive switch unit of the subject invention.

Referring now to the drawings wherein the showing are for the purpose of illustrating the preferred embodiment of the invention only, and not for the purpose of limiting the same, FIG. 1 illustrates, in block diagram form, the disclosed dynamically-active switching system. A pulse generator A generates a plurality of control pulses which are communicated to pulse adder B. Pulse information from pulse adder B is communicated to RFI sensor C and gating network D. Gating network D further obtains pulse information from generator A. An output from gating network D is provided to a hand sensor E. An output of hand sensor E is provided to signal conditioner F, which, in turn, communicates a signal to power supply G. In the preferred embodiment, the RFI sensor C and hand sensor E are contiguously formed in a palm-button H, the details of which will be provided below. More particularly, sensor units are disposed in a top portion of the palm button with associated support circuitry A-F therebelow. Finally, the power supply 6 is disposed in a portion of the palm button H furthest removed from the sensors C and E in the preferred embodiment.

Figure 2:
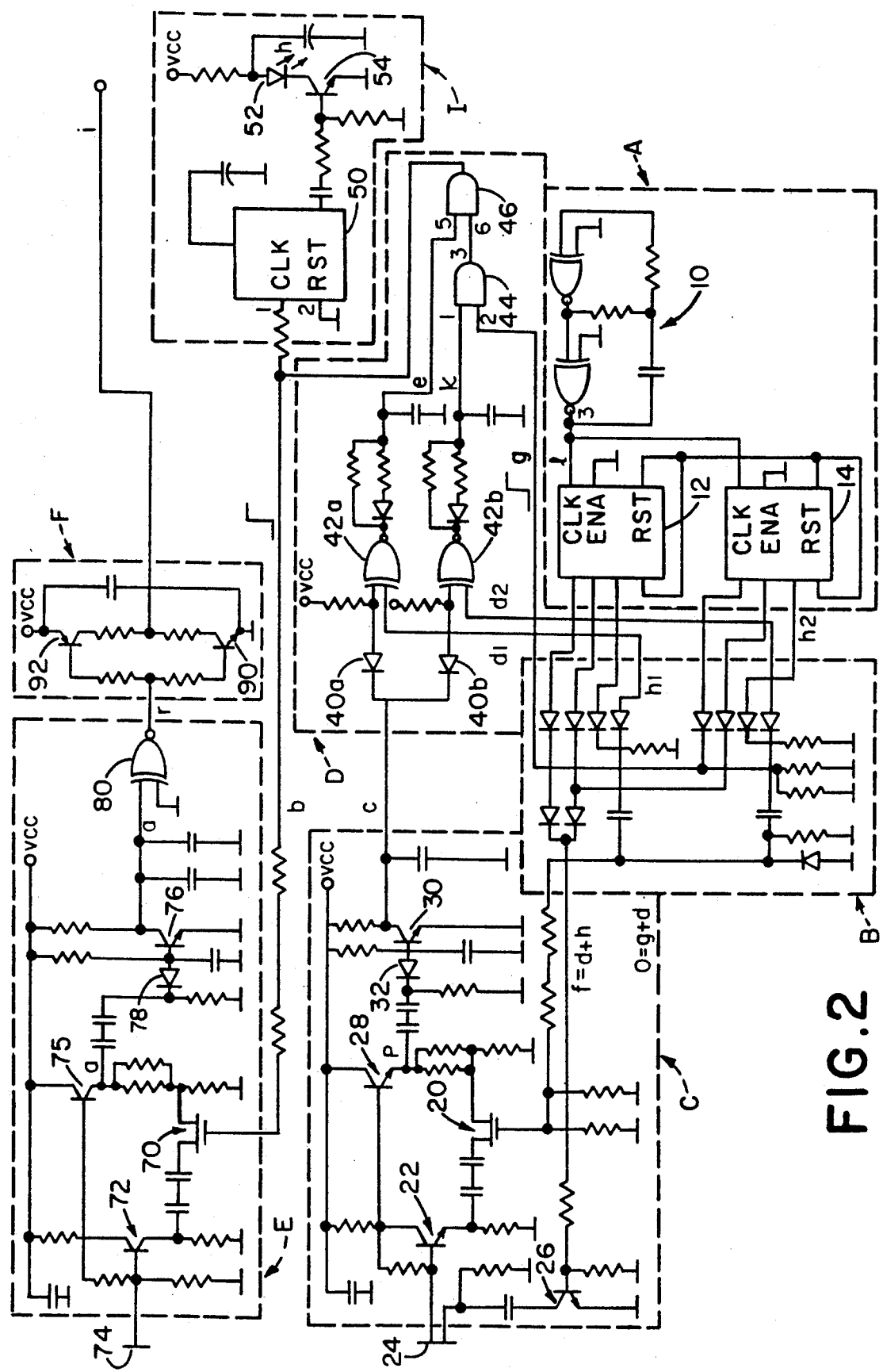
FIG. 2 is schematic diagram detailing construction of the diagram of FIG. 1.

Turning now to FIG. 2, a schematic diagram including the generator A, pulse adder B, RFI sensor C, gating network D, hand sensor E, and signal conditioner F, is provided. Also included is a test indicator circuit I which functions to provide a visual output representative of the functionality of the RFI sensor C in a manner to be detailed below.

Figure 3:
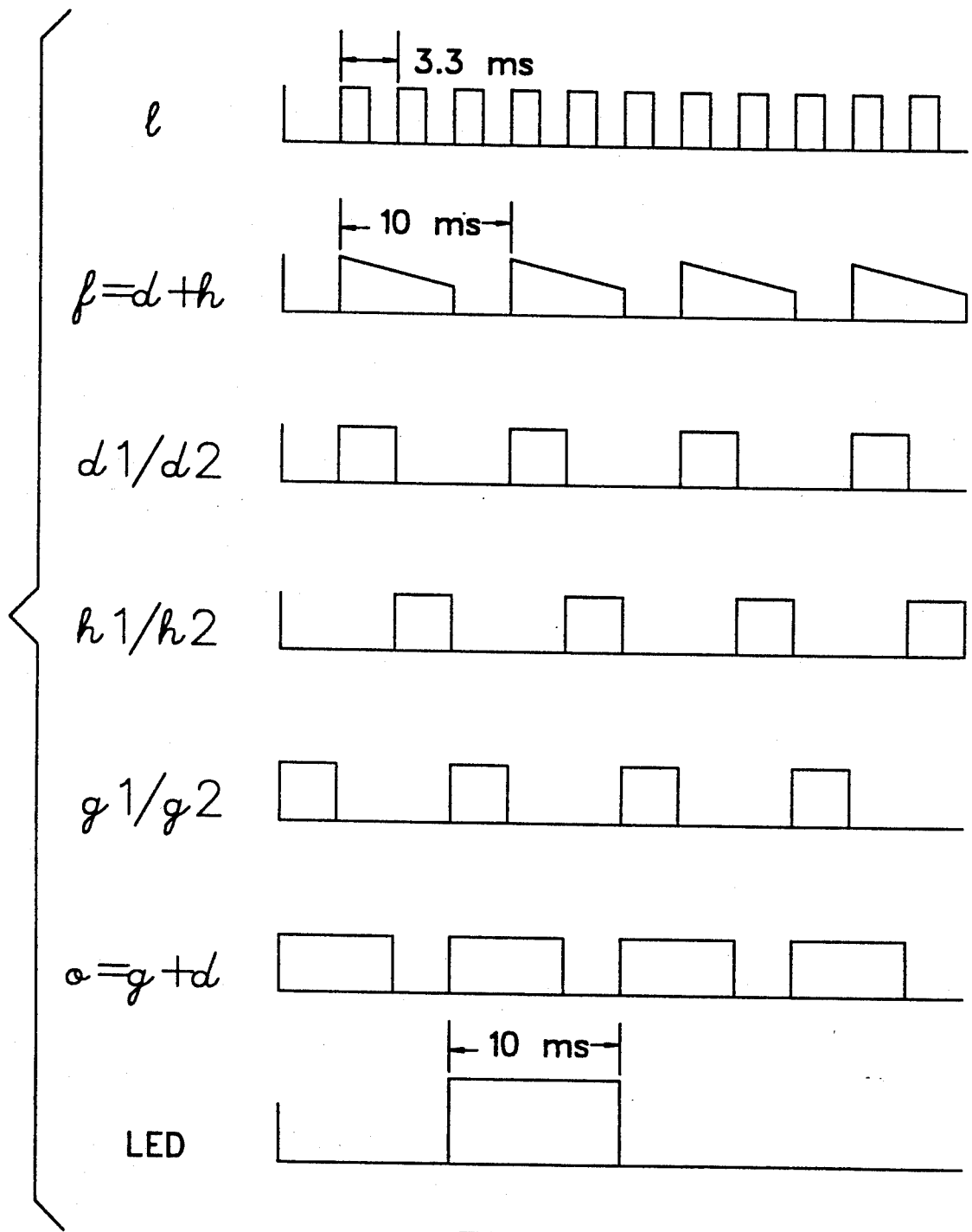
FIG. 3 is a timing diagram of pulse trains implemented in conjunction with the system of FIGS. 1 and 2.

With continuing reference to FIG. 2, and additional reference to FIG. 3, functionality of the circuits of FIG. 2 will be described. Reference will be made to the blocks of FIG. 1, illustrated in phantom in FIG. 2, by the earlier-introduced names. It will be understood that such reference, in fact, is provided to a portion of the entire circuitry of FIG. 2.

The generator A includes a clock circuit 10 formed of a resistor/capacitor network and two NOR gates interconnected as illustrated. The R/C time constant of the incorporated resistors and capacitor, coupled with the NOR gates as illustrated, dictates and forms a periodic square wave pulse train 1. In the preferred embodiment, the period of the pulse train 1 is 3.3 milliseconds in duration.

The pulse train 1 is communicated to first and second counters 12 and 14, respectively, forming the clock input thereto. In the preferred embodiment, these counters are suitably formed from common "4017" counters. Two counters are used for redundancy in a manner which will be appreciated by understanding the following description. The output of the Q0 bit least significant of each of counters 12 and 14 forms signal g1 and g2, respectively. Output of bits Q1 of each of timers 12 and 14 form signal d1 and d2, respectively. Output of timer bits Q2 of each of timer 12 and 14 forms signals h1 and h2, respectively. The Q3 bit output of each of timers 12 and 14 is communicated to its own reset pin to recommence the counting sequence of their shared clock input pulses 1.

The pulses d1, d2, g1, g2, and h1, h2 are communicated to the pulse adder B. The pulses d1 and d2 are also communicated to the gating network D for use as will be described below. The adder B functions to form a hard-wired OR operation on selected signal combinations. More particularly, the d1 and d2 signals are combined with the g1 and g2 signals to form the composite signal °. The d1 and d2 signals to form the composite h1 and h2 signals to form the composite signal f. The ° and f signals are communicated to RFI sensor C.

In the RFI sensor C, the signal f forms an input to the base of field effect transistor ("FET") 20, thus turning it on. The source-drain junction of FET 20 is in series with the emitter of NPN transistor 22, the base of which is connected to one terminal of a radio frequency sensor terminal 24. A corresponding connection to RF sensor 24 is communicated to a collector of NPN transistor 26, the base of which is driven by signal °. Turning on transistor 26 provides a path from $V_{cc}$ to ground through RF sensor terminal 24. Remaining capacitors and resistors of the circuit are provided for biasing and isolation of various of the components as will be appreciated by one of ordinary skill in the art.

With the above-described circuitry, provision of pulse o to transistor 26 allows for amplification of a signal induced on RF sensor 24. This signal is amplified by a transistor 22, activated by FET 20. Further amplification is accomplished via NPN transistor 28. The base of the transistor 30 is isolated through a diode 32 from the emitter of transistor 28. NPN transistor 30 is normally on, but turned off when its associated sensor 24 detects RFI application sufficient voltage at its base. It normally conducts through its emitter-collector junction, thus clamping its emitter to ground (logical 0) unless RFI is detected. The resultant output forms a signal c which is representative of a radio frequency as sensed by radio frequency sensor terminal 24. The timing of this pulse is dictated by the signal f and °. The signal c is communicated to the gating network D.

Turning now to the gating network D, it will be seen that the signal c, received from the RFI sensor C, is communicated through diode 40a to NOR gate 42a and through diode 40b to NOR gate 42b. The remaining input to NOR gate 42a is formed from signal d1 obtained from the generator A. The remaining input for NOR gate 42b is formed from signal d2 of the generator A. NOR gates 42a and 42b work in concert with timers 12 and 14, respectively, to provide redundancy protection.

An output signal k of NOR gate 42b forms an input to AND gate 44. A remaining input of AND gate 44 is formed from the signal g of the generator A. The output of AND gate 44 is combined, through AND gate 46, with signal e resultant from NOR gate 42a. A output of AND gate 46, signal b, is communicated to both the hand sensor E and the test indicator I.

From the above-described interconnection, it will be seen that the presence of a low signal c (logical 0) will force a high output from NOR gate A in the presence of a low signal d1. Similarly, presence of a low signal c will result in a high output k of NOR gate 42b in the presence of a low signal d2. Concurrency in the output of signals e, k, and g forces an output of AND gate 46 high. By virtue of the provision of signal g as an input of NOR gates 42, this high will be synchronized thereto.

From the interconnection illustrate for gating network D, it will be seen that an output signal b from AND gate 46 will be formed each time the signal c is low concurrently with the signals d1 and d2. The presence of a high signal e from gate 42a and a high signal k from gate 42b will activate AND gates 44 and 46 simultaneously with pulse G. A resultant pulsating high in signal b therefore indicates that no RF interference of a sufficient magnitude is provided. A consistent low signal B represents the presence of sensed RFI.

The pulse b sequence is communicated to test indicator I, (when there is no sensed RFI) more particularly to a clock input of a 4024 timer 50 thereof. Output Q6 of this timer, coupled with the timing dictated by clock circuit 10, functions to provide a visual indicator via light emitting diode 52 that a set number of pulses have been counted. This output turns on transistor 54 to drive the LED by providing a path to ground through its emitter-collector junction. In this way, a visual indication as to functionality of the circuitry preceding the test indicator I, more particularly the functionality of the RFI sensor C, is provided. The timer serves to set the period and duration of the LED on time to be humanly perceivable.

Turning now to the hand sensor E, it will be seen that the signal b received from the gating network D forms an input to the base of FET 70. The source-drain junction of FET 70 is provided in series with the emitter of an NPN transistor 72. Accordingly, the FET 70 will periodically turn on and off if RFI is not present. The base of transistor 72 is connected to a capacitive sensor terminal 74. With this connection, signal induced on capacitive sensor 24 is amplified through transistor 72 upon the presence of signal b at the base of FET 70. Further amplification of this signal is provided through transistor 75. Biasing and isolation are accomplished through the capacitors and resistors, interconnected as shown.

NPN transistor 76 is normally turned on. In accordance with a signal applied to its base, when on, transistor 76 clamps signal a to ground or a logical "0." Detected hand capacitance thereby turns off transistor 76. Isolation between the emitter of transistor 75 and the base of transistor 76 is accomplished through diode 78. The resulting signal, signal a, forms one input to a NOR gate 80, the other input of which is tied low. Thus, the NOR gate 80 serves as an invertor. When signal a is low, output signal r of NOR gate 80 is high.

The signal r is communicated to signal conditioner F which is a push/pull amplifier formed from NPN transistor 90 and PNP transistor 92. The output signal, signal i from signal conditioner F provides for control to the power supply G as illustrated in FIG. 1. As with signal b signal i will be pulsed on periodically if both the hand sensor is active and no RFI is detected. Any failures will result in a constant voltage level of signal i. Such a constant level represents either (1) RFI from sensor 24; (2) no capacitance at hand sensor 74; or (3) a "stuck-at" fault within the preceding circuitry.

Figure 4:
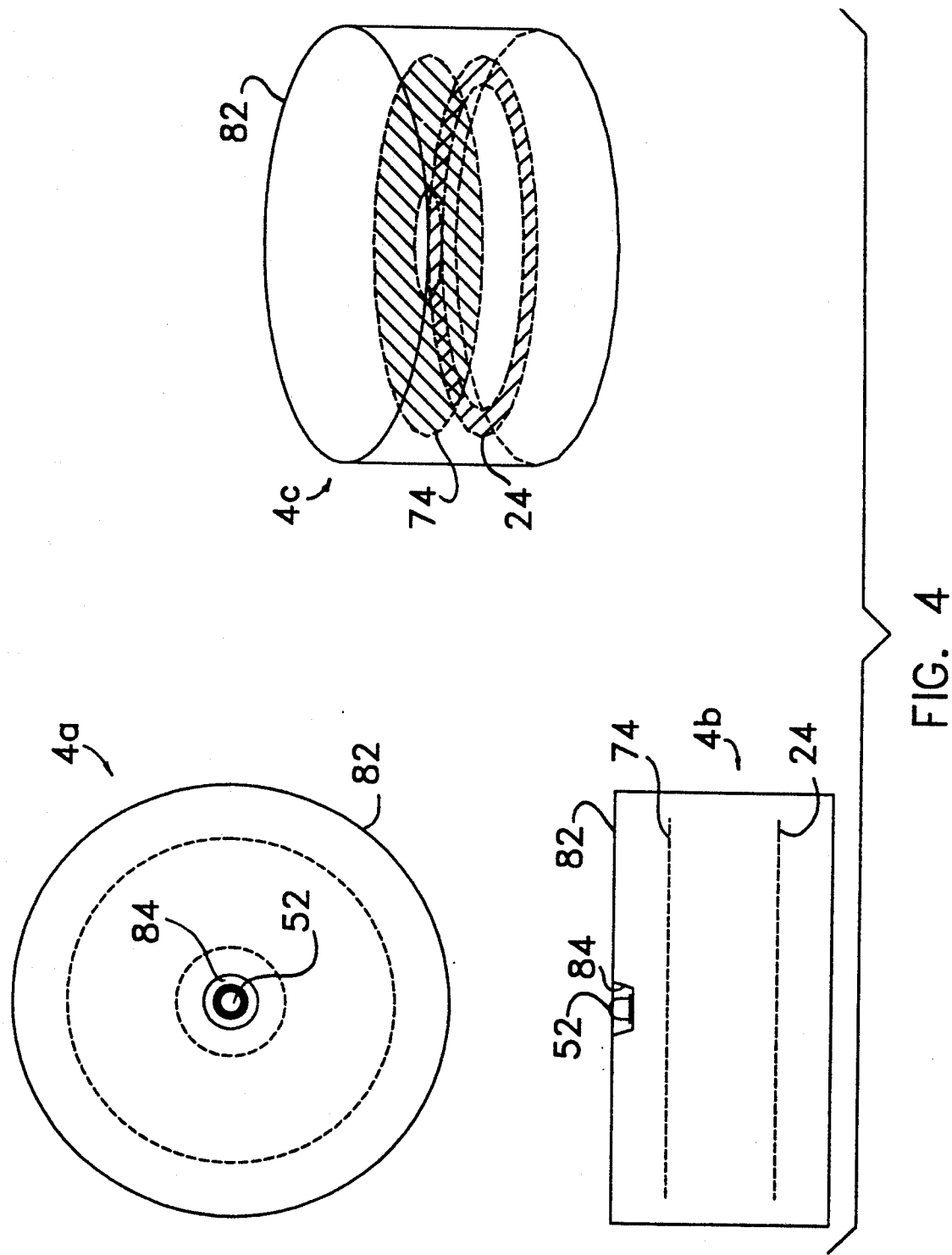
FIG. 4 provides three views of a sensor unit or palm-button unit H of FIG. 1.

Turning to FIG. 4, an embodiment of the palm-button H is provided. Included is a top view 4a, side view 4b, and a perspective view 4c. The figure evidences respective orientation of RF sensor 24, suitably comprised of a conductive plate suitably formed of a circular copper plate with a generally concentric aperture portion. A capacitive sensor terminal 74 is similarly formed of a circular conductive plate having an aperture with an internal diameter greater than that of the RF sensor terminal 24 in the preferred embodiment. The terminals 24 and 74 are secured in housing 82 so that the planes of each are generally parallel to one another. The housing 82 is suitably formed of any non-conductive material such as plastic. Although not illustrated, separation between the sensor 72 and 74 is suitably accomplished with styrofoam or the like.

As illustrated in views 4a and 4b of FIG. 4, the LED 52 (FIG. 2) is advantageously provided within a recess 84 on a surface of housing 82. When so disposed, the visual indication of operability as evidenced by the LED 52 will be readily apparent to an operator prior to engagement with the palm-button unit without impeding contact therewith.

Figure 5:
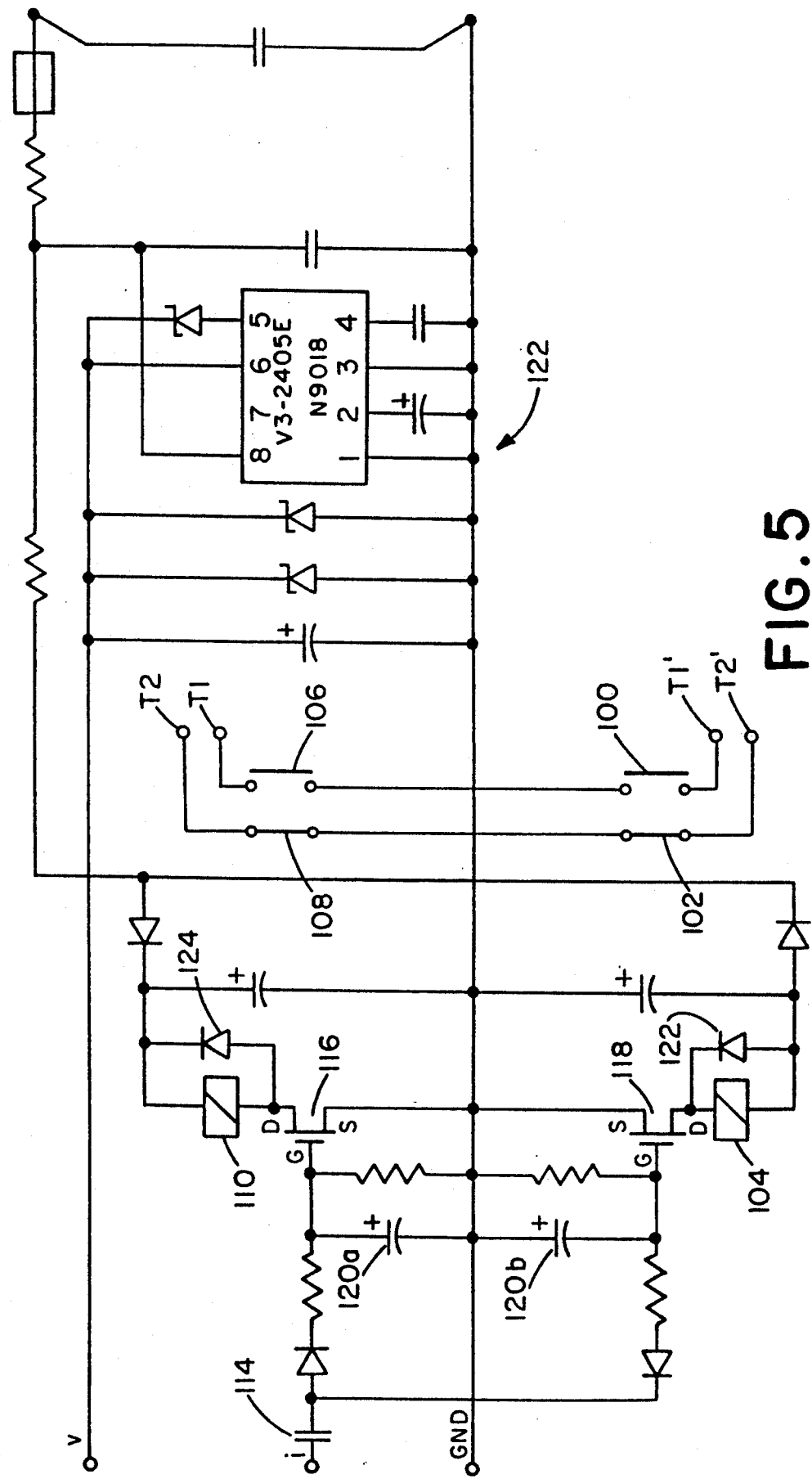
FIG. 5 is a schematic diagram of the control system of FIGS. 1 and 2.

Turning now to FIG. 5, the power supply G of FIGS. 1 and 2 will be described. The circuit provides a normally open circuit output form between terminals T1 and T1' and a normally closed circuit output formed between terminal T2 and T2'. The series connection between the terminals T1 and T1' and terminals T2 and T2' is utilized for redundancy in the event one of the contacts therein becomes stuck open or closed. The position of normally-open contact 100 and normally-closed contact 102 is dictated by current across a coil 104. Similarly, positioning of normally open contact 106 and normally closed contact 108 is dictated by power across coil 110. The coils are energized by providing the input signal i from the signal conditioner F. Capacitor 114 provides a d.c. filter which prevents activation of FETs 116 or 118 unless a periodic pulse i is provided. The capacitors 120a and 120b provide a smoothed d.c. signal to each gate of FETs 116 and 118. The signal i thereby enables the source-drain junction of each of FETs 116 and 118 by applying gating current thereto.

Coils 104 and 110 are protected from back EMF by diodes 122 and 124 respectively. Regulated power for energizing both coils 104 and 110 is provided by a dc supply 122 which includes a voltage regulator, zener voltage clamp, and filter. The particulars of the dc supply 122 are well within the understanding of one of ordinary skill in the art.

Figure 6:
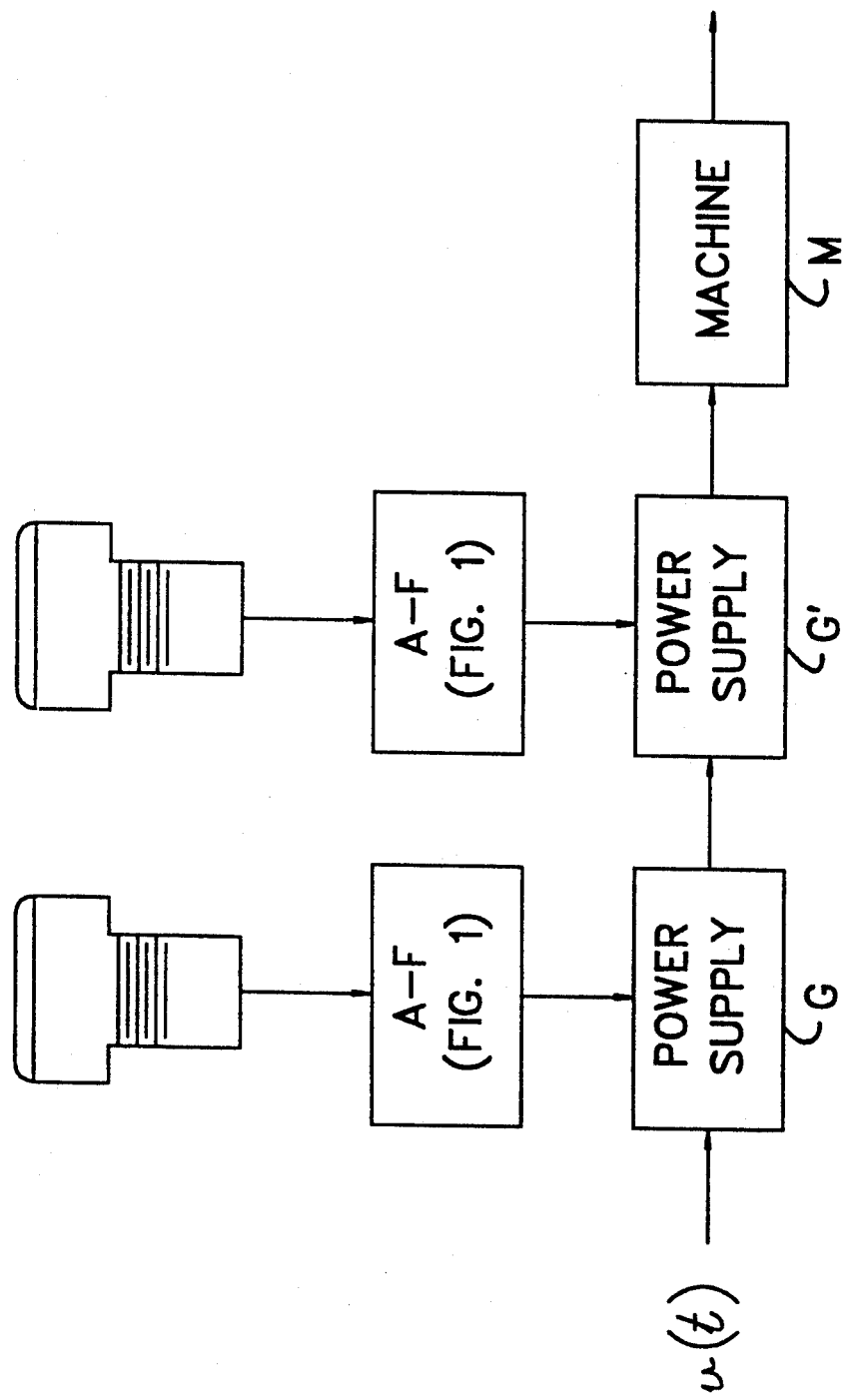
FIG. 6 is a block diagram of a two-handed controller system utilizing the improved circuitry of FIGS. 1 and 2.

As noted above, industrial control systems often use two contact switches for increased operator safety. FIG. 6 shows relative placement of two of the above-described switches with their respective power supplies G and G' disposed in a logical AND orientation for control of machine M.

This invention has been described with reference to the preferred embodiment. Obviously, modifications and alterations will occur to others upon reading and understanding of this specification. It is intended that all such modifications and alterations be included insofar as they come within the scope of the appended claims or the equivalents thereof.

Having thus described the invention, it is now claim:

1. A switching system including a first capacitive switch unit, the capacitive switch unit comprising:
   a capacitive sensor terminal;
   a radio frequency sensor terminal disposed proximate to the capacitive sensor terminal;
   sensor means adapted for sensing a first voltage induced within the capacitive sensor terminal by an associated object proximate thereto;
   radio frequency sensor means adapted for sensing a second voltage induced within the radio frequency sensor terminal by a radio frequency; and
   a controller including,
      trigger signal generating means for generating a trigger signal in accordance with a sensed first voltage,
      cutoff signal generating means for generating an inhibit signal in accordance with a sensed second voltage, and activation means for selectively generating an activate signal in accordance with a trigger signal and a cutoff signal.

2. The switching system of claim 1 wherein the controller further includes means for generating the cutoff signal when a sensed second voltage exceeds a preselected level.

3. The switching system of claim 2 wherein the first capacitive switch unit further comprises:
testing means for periodically testing at least one of the radio frequency sensor means, the cutoff signal generating means, and the activation means; and
means for outputting a signal representative of operability as determined by the testing means.

4. The switching system of claim 3 wherein the first capacitive switch unit further comprises:
pulse generator means for generating periodic voltage pulses;
means for communicating the periodic voltage pulses to the controller; and
means for activating at least one of the trigger signal generating means, cutoff signal generating means, and activation means in accordance with the periodic pulses.

5. The switching system of claim 4 wherein the activation means includes means for suppressing the activation signal in the presence of the cutoff signal.

6. The switching system of claim 5 further comprising:
a second capacitive switch unit functionally equivalent to first capacitive unit; and
means for generating a system enable system in accordance with activation signals of the first and second capacitive switch units.

7. In a switching system including a capacitive sensor, a radio frequency sensor, and a controller, a method of selectively enabling an electrically controllable apparatus comprising the steps of:
(a) generating a first periodic voltage pulse;
(b) inducing a second periodic voltage pulse into the radio frequency sensor in accordance with the first periodic voltage pulse;
(c) generating a signal representative of a presence of radio frequency energy;
(d) sensing a capacitive change in the capacitive sensor terminal by in accordance with an object positioned generally proximate thereto;
(e) generating a trigger signal in accordance with a sensed capacitive change in the capacitive sensor; and
(f) suppressing the trigger signal in accordance with the signal representative of a presence of radio frequency energy.

8. The method of claim 7 further comprising the steps of:
(g) periodically testing operability of the radio frequency sensor; and
(h) generating a signal representative of an outcome of the step of periodically testing.

9. The method of claim 8 wherein step (c) includes the steps of:
(c1) generating a strength signal representative of a strength of radio frequency energy;
(c2) comparing the strength signal to a preselected threshold value; and
(c3) generating the signal representative of a presence of radio frequency energy in accordance with the comparison of step (c2).

10. The method of claim 9 wherein:
step (a) includes the step of generating the first periodic voltage pulse as comprising first, second and third periodic pulse trains mutually defined such that,
a leading edge of individual pulses of the second pulse train occurs generally at a trailing edge of a corresponding individual pulse of the first pulse train,
a leading edge of individual pulses of the third pulse train occurs generally at a trailing edge of a corresponding individual pulse of the second pulse train, and
a leading edge of individual pulses of the first pulse train occurs generally at a trailing edge of a corresponding individual pulse of the third pulse train; and
step (b) includes the step of forming the second periodic voltage pulse from a combination of two of the pulse trains.

11. The method of claim 10 wherein step (d) includes the step of synchronizing the signal representative of a presence of radio frequency energy with at least one of the pulse trains.

12. A two hand switching mechanism comprising:
first and second capacitive switching units, each capacitive switching unit including,
a capacitive sensor terminal;
a radio frequency sensor terminal disposed proximate to the capacitive sensor terminal;
sensor means adapted sensing a first voltage induced within the capacitive sensor terminal by an associated object proximate thereto;
radio frequency sensor means adapted for sensing a second voltage induced within the capacitive sensor terminal by a radio frequency;
a controller including,
trigger signal generating means for generating a trigger signal in accordance with a sensed first voltage,
cutoff signal generating means for generating an inhibit signal in accordance with a sensed second voltage, and
activation means for selectively generating an activate signal in accordance with a trigger signal and a cutoff signal;
combining means for combining logically combining activation signals from the first and second capacitive switching units; and
means for generating a system activation signal in accordance with an output of the combining means.

13. The two hand switching system of claim 12 wherein at least one capacitive switching unit further includes:
pulse generator means for generating a first periodic voltage pulse;
means for inducing a second periodic voltage pulse into the radio frequency sensor in accordance with the first periodic voltage pulse; and
means for selectively enabling the cutoff signal generating means in accordance with the second periodic voltage pulse.

14. The two hand switching system of claim 13 wherein at least one capacitive switching unit further includes:
means for synchronizing the inhibit signal with at least a portion of the first periodic voltage pulse.

15. The two hand switching system of claim 14 wherein at least one capacitive switching unit further includes testing means for periodically testing at least one of its radio frequency sensor means, cutoff signal generating means, and activation means and includes means for outputting a signal representative of operability as indicated by the testing means.

* * * * *